(12) United States Patent
Hosemann et al.

(10) Patent No.: US 10,825,729 B2
(45) Date of Patent: Nov. 3, 2020

(54) METHOD FOR PRODUCING AN INTEGRATED CIRCUIT, INTEGRATED CIRCUIT, X-RAY DETECTOR AND X-RAY DEVICE

(71) Applicant: Siemens Healthcare GmbH, Erlangen (DE)

(72) Inventors: Michael Hosemann, Erlangen (DE); Kay Viehweger, Dresden (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 16/385,069

(22) Filed: Apr. 16, 2019

(65) Prior Publication Data
US 2019/0326172 A1 Oct. 24, 2019

(30) Foreign Application Priority Data
Apr. 23, 2018 (DE) .................. 10 2018 206 223

(51) Int. Cl.
| | |
|---|---|
| *H01L 21/768* | (2006.01) |
| *H01L 31/18* | (2006.01) |
| *H01L 27/08* | (2006.01) |
| *H01L 31/02* | (2006.01) |
| *H01L 23/48* | (2006.01) |
| *H01L 31/08* | (2006.01) |

(52) U.S. Cl.
CPC ...... *H01L 21/76898* (2013.01); *H01L 23/481* (2013.01); *H01L 27/0814* (2013.01); *H01L 31/02005* (2013.01); *H01L 31/085* (2013.01); *H01L 31/1804* (2013.01)

(58) Field of Classification Search
CPC ............ H01L 21/76898; H01L 23/481; H01L 27/14676; H01L 31/085; H01L 29/66106; H01L 27/0248; H01L 27/0255; H01L 27/0629; H01L 27/0788; H01L 23/60
See application file for complete search history.

(56) References Cited

U.S. PATENT DOCUMENTS

| | | |
|---|---|---|
| 9,035,460 B2 | 5/2015 | Matsuura |
| 2004/0113086 A1 | 6/2004 | Heismann et al. |

(Continued)

FOREIGN PATENT DOCUMENTS

| | | |
|---|---|---|
| DE | 10244177 A1 | 4/2004 |
| DE | 102016209578 A1 | 12/2017 |

OTHER PUBLICATIONS

German Office Action for German Application No. DE10102018206223.4 dated Feb. 21, 2019.

*Primary Examiner* — Hsien Ming Lee
(74) *Attorney, Agent, or Firm* — Harness, Dickey & Pierce, P.L.C.

(57) ABSTRACT

A method is for producing an integrated circuit. In an embodiment, a metallic contact structure, for a through silicon via with a contact area, is applied onto a silicon substrate without an insulating intermediate layer. An interconnection structure, with at least one insulating layer and at least one interconnection layer, is applied onto the silicon substrate. The contact structure is or will be contacted with the interconnection layer or at least one of the possibly plurality of interconnection layers, and a diode structure for blocking a current flow between the contact area of the metallic contact structure and the silicon substrate is introduced into the silicon substrate.

16 Claims, 11 Drawing Sheets

(56) References Cited

U.S. PATENT DOCUMENTS

2006/0237756 A1* 10/2006 Park .................. H01L 27/2409
257/296
2010/0237386 A1    9/2010  Lin et al.
2011/0095367 A1    4/2011  Su et al.

* cited by examiner

METHOD FOR PRODUCING AN INTEGRATED CIRCUIT, INTEGRATED CIRCUIT, X-RAY DETECTOR AND X-RAY DEVICE

PRIORITY STATEMENT

The present application hereby claims priority under 35 U.S.C. § 119 to German patent application number DE 10 2018 206 223.4 filed Apr. 23, 2018, the entire contents of which are hereby incorporated herein by reference.

FIELD

At least one embodiment of the application generally relates to a method for producing an integrated circuit. At least one embodiment of the application further generally relates to such an integrated circuit which is produced in particular by the method and forms part of an X-ray detector to which the invention also relates. Furthermore, at least one embodiment of the application generally relates to an X-ray device, in particular a computed tomography device.

BACKGROUND

Integrated circuits are used, in particular, as chips for processors, controllers, sensors (including integrated or connected evaluating circuits) and the like. In order to be able to make better use of the usually relatively sparsely available structural space, a three-dimensional stacking of individual chips or parts thereof is often utilized. For this purpose, so-called through silicon vias (TSVs) are required in order to be able to contact the individual circuit units through the silicon support layer (the silicon substrate) to the units lying thereunder. In the production of integrated circuits with such through silicon vias, in particular with the so-called via-last process (i.e. the via is first introduced into the silicon substrate after the formation of the interconnections), an insulating oxide arranged under the metal layers of the interconnections must be opened in order to be able to form a contact to the respective through silicon via. The, in particular metal, structure with which the respective through silicon via is contacted is herein designated a "landing pad".

Typically, the insulating oxide forms an insulating layer arranged between the interconnections and the silicon substrate, which is required for testing the integrated circuit. Such a test is useful before the formation of the through silicon via, particularly from an economic viewpoint, and is therefore normally carried out from an upper side (facing away from the silicon substrate) (by way of a contact of the landing pad via a "test pad" arranged on the surface). The opening of the insulating layer for an orderly contacting of the respective landing pad with the associated through silicon via is however, in particular while simultaneously preventing damage to surrounding structures, often difficult and/or costly.

An alternative construction in which the metal layers of the interconnection, in particular the respective landing pad are applied directly onto the conductive silicon substrate leads thereto that the metal layers or adjoining landing pad are short-circuited by the silicon substrate. As a result, a test of the functionality of the integrated circuit before the formation of the through silicon vias is no longer possible. Such a test is, however, often required for obtaining a good yield, in particular for an economical production.

From the printed publication DE 102 44 177 A1, there is known an image detector for an X-ray apparatus with photosensors, which each have at least two contacts at which, on detection of X-ray radiation, an electrical signal occurs. The image detector is characterized in that, in each case, at least one contact of the photosensors is arranged on their rear side facing away from the image source and in that an organic photodiode material is used as material for the photosensors.

From the printed publication DE 10 2016 209 578 A1, there is known an integrated circuit with a leakage current monitoring function. The integrated circuit comprises a first circuit, a first supply voltage source for voltage supply to the analogue circuit, a first supply via between the supply voltage of the first circuit and the first circuit and the first circuit, a first ground via between the first circuit and ground, a second circuit, a second supply voltage source for voltage supply to the second circuit, a second supply via between the supply voltage of the second circuit and the second circuit and a second ground via between the second circuit and ground. Further parts of the integrated circuit are a voltage measuring circuit which is connected in parallel with one of the two circuits, a measuring resistor between one of the two supply voltages and the voltage measuring circuit, and a switch-over device which is configured in a measuring mode to switch the measuring resistor in series with two vias of different circuits.

SUMMARY

At least one embodiment of the invention improves the production of an integrated circuit.

At least one embodiment of the invention is directed to a method for producing an integrated circuit. At least one embodiment of the invention is directed to an integrated circuit. At least one embodiment of the invention is directed to an X-ray detector and/or an X-ray device. Advantageous and, partly per se inventive, embodiments and developments of the invention are disclosed in the claims and the description below.

At least one embodiment of the invention is directed to a method for producing an integrated circuit. According to at least one embodiment of the method, a metallic contact structure (referred to hereinafter as a "landing pad") for a through silicon via is applied with a contact area onto a silicon substrate without an insulating intermediate layer. An interconnection structure which comprises at least one insulating layer (e.g. a nitride or oxide layer) and at least one interconnection layer embedded in the insulating layer or applied onto it is applied onto the silicon substrate (and optionally onto the landing pad). The landing pad is or will be contacted with the interconnection layer or at least one of the possibly plurality of interconnection layers (which are "stacked", in particular, in the thickness direction, i.e. arranged over one another). Furthermore, for blocking a current flow between the contact area of the landing pad and the silicon substrate, a diode structure which forms, in particular, at least one diode is introduced into the silicon substrate.

At least one embodiment of the integrated circuit comprises the silicon substrate, the metallic contact structure (i.e. the landing pad), which is applied with the contact area thereof, without interposition of the insulating intermediate layer, onto the silicon substrate and the through silicon via, which is at least partially contacted by the contact area of the landing pad. Furthermore, the integrated circuit comprises the interconnection structure applied onto the silicon substrate, which in turn has the at least one insulating layer and the at least one interconnection layer. The landing pad is contacted with the interconnection layer or at least one of the possibly plurality of interconnection layers. Furthermore, for blocking the current flow between the contact area of the landing pad and the silicon substrate, the diode structure which forms the at least one diode is introduced into the silicon substrate. This diode structure is additionally penetrated by the through silicon via.

In a separate embodiment of the invention, the above-described integrated circuit forms a part of a radiation detector, specifically an X-ray detector. Specifically, the integrated circuit thereby forms a part of an evaluating unit arranged downstream of a detection unit (for example, a sensor) of the X-ray detector. Preferably, the integrated circuit thereby faces toward the detection unit (optionally attached thereto in a signal-transmitting manner) and is configured for evaluating electrical signals received from the detection unit. For this purpose, the integrated circuit comprises e.g. A-D converters, discriminators and the like.

The X-ray detector is thereby itself part of an X-ray device, for example, a computed tomography device. This X-ray device also represents a separate embodiment of the invention.

BRIEF DESCRIPTION OF THE DRAWINGS

Example embodiments of the invention will now be described in more detail, making reference to the drawings. In the drawings.

Figure 1:
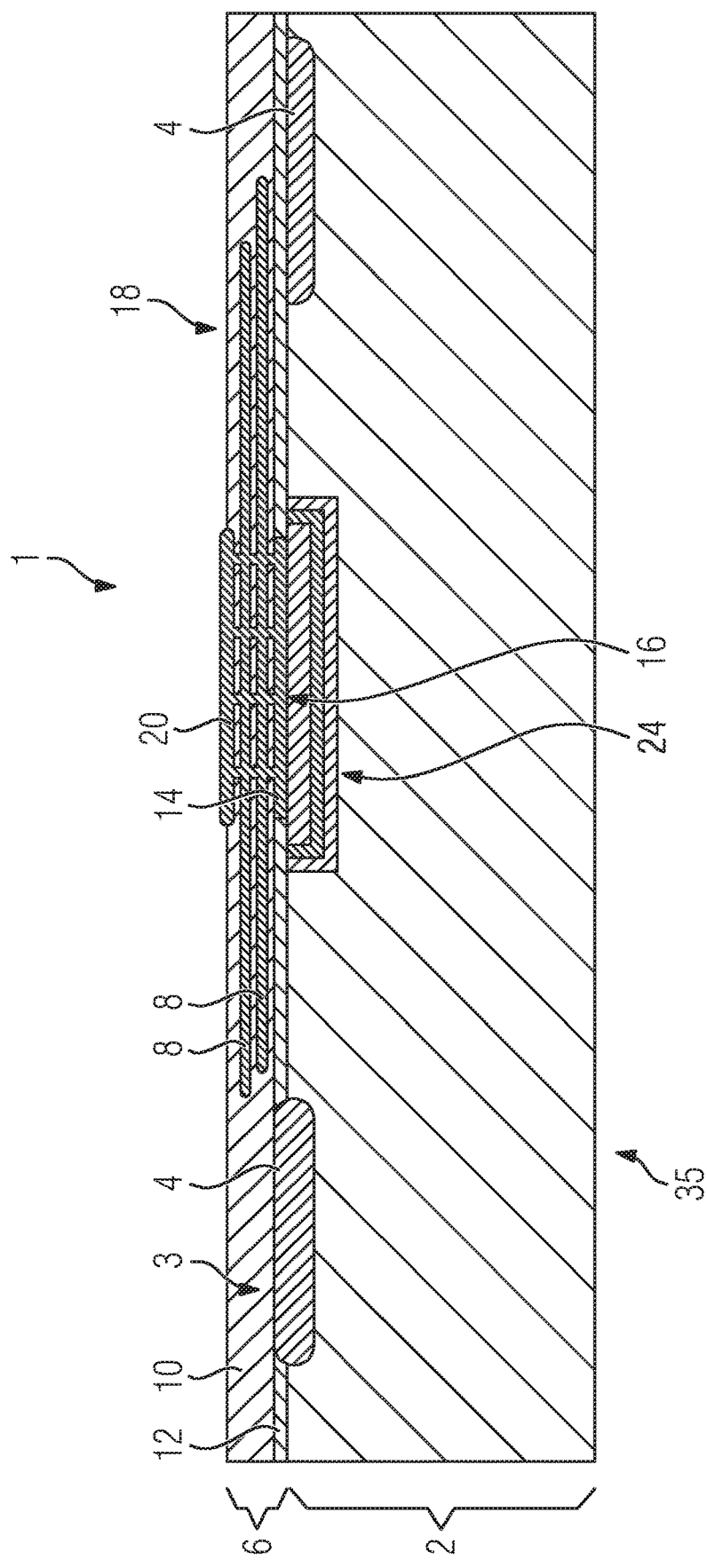
FIG. 1 shows a schematic sectional view of an integrated circuit in a production intermediate step.

Parts which correspond to one another are provided with the same reference signs in all the drawings.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the invention is directed to a method for producing an integrated circuit. According to at least one embodiment of the method, a metallic contact structure (referred to hereinafter as a "landing pad") for a through silicon via is applied with a contact area onto a silicon substrate without an insulating intermediate layer. An interconnection structure which comprises at least one insulating layer (e.g. a nitride or oxide layer) and at least one interconnection layer embedded in the insulating layer or applied onto it is applied onto the silicon substrate (and optionally onto the landing pad). The landing pad is or will be contacted with the interconnection layer or at least one of the possibly plurality of interconnection layers (which are "stacked", in particular, in the thickness direction, i.e.

arranged over one another). Furthermore, for blocking a current flow between the contact area of the landing pad and the silicon substrate, a diode structure which forms, in particular, at least one diode is introduced into the silicon substrate.

The expression "insulating intermediate layer" should be understood here and below as a layer formed from a material deviating from the material of the silicon substrate which is formed, for example, by deposition onto the silicon substrate or by converting a surface layer of the silicon substrate into another material. In particular the material of this intermediate layer is a nitride, for example, a silicon nitride or an oxide, for example, a silicon oxide. The latter is optionally formed by a heat treatment and an associated oxidation of the silicon of the surface layer of the silicon substrate.

The expression "diode structure" in particular should be understood here and below as being at least one diode which is introduced into the silicon substrate such that the current flow between the contact area of the landing pad and the silicon substrate is completely blocked (prevented). The diode structure is therefore preferably generated with an areal extent which corresponds at least to the extent of the or each contact area.

The or each interconnection layer serves for the contacting of (in particular "active" or "switchable") circuit structures (which are formed, in particular, in the surface of the silicon substrate, for example, transistors and the like) between one another or for their contacting with contact elements for contacting with external components. In a simple variant, the landing pad herein forms a part of the interconnection layer or one (in particular the "lowest") of the possibly plurality of interconnection layers and is therefore contacted therewith "from the outset". In an alternative variant, the landing pad is formed as an independent element and during the formation of the interconnection structure, is contacted with the or each interconnection layer.

The method steps described above are not fixed in their sequence to the sequence given above, but preferably arise in a sequence which is possibly dependent on the specific production process and is technically suitable. Therefore, the method steps can deviate in their actual sequence from the sequence described above.

In that the landing pad is applied onto the silicon substrate without the insulating intermediate payer, advantageously in the formation of the through silicon via, the opening of this intermediate layer can be dispensed with. Thus a relatively economical production of the integrated circuit that also entails a low risk with regard to damaging surrounding structures is possible. In fact, however, testing of the integrated circuit before the formation of the through silicon via is also possible since the current flow between the landing pad and the silicon substrate, in particular an electrically conductive region of the silicon substrate that is not doped or only slightly doped is blocked (prevented). Thus, advantageously, particularly given a plurality of existing landing pads, a short circuit between these is effectively prevented. The blocking effect "between" the respective landing pad and the silicon substrate should, in principle, be understood here and below as being such that the current flow in at least one (blocking) direction—i.e. from the landing pad to the silicon substrate or vice versa—and optionally also in both directions, can be prevented.

In the (preferred) case that a plurality of landing pads are formed separately from one another on the silicon substrate, in a preferred method variant for each individual landing pad, a separate accordingly assigned diode structure is generated.

Particularly in order to enable the testing of the integrated circuit, in a suitable method embodiment, the landing pad (and thus also the at least one interconnection layer contacted with the landing pad) contacts an outer area of the interconnection structure opposite to (or facing away from) the silicon substrate, specifically the insulating oxide layer, with a test connection element (hereinafter also referred to as "test pad"). Preferably, the test pad is applied for this purpose to the outer surface of the interconnection structure.

In a further suitable method embodiment, for the respective contact area of each landing pad in the context of the diode structure, in each case "only" one diode which is configured blocking, in particular, in the direction toward the silicon substrate.

In a preferred method embodiment, however, the diode structure is configured such that a series connection of two diodes is created for blocking the current flow between the respective landing pad, in particular between its respective contact area and the silicon substrate. This means that two diodes following one another in particular in the thickness direction of the silicon substrate and contacting one another are embedded in the silicon substrate.

In a preferred development of the method embodiment described above, the two diodes (in particular assigned to the respective contact area of the landing pad) of the diode structure connected in series are oriented mirror-inverted with regard to their blocking direction. Particularly in test operation of the integrated circuit, one of the two diodes is thereby always operated in the blocking direction. By this, the current flow between a plurality of landing pads via the silicon substrate is effectively prevented and thus the testing of the integrated circuit, in particular via the or each test pad—and preferably before the formation of the through silicon via—is enabled.

In order to create the diode structure, in a suitable method embodiment, at least one well, in particular a multi-well is made use of. The expression "well" should be understood here and below to mean, in particular, a region formed in a trough-like manner and having a doping deviating from the surrounding silicon material, in particular, a layer within the (often slightly doped, i.e. only weakly in comparison with the respective well) silicon substrate. The number of wells that is required for forming the one or two diodes connected in series is dependent on the selected production process (for example, a production-specific variant of a CMOS production process). For the series connection of the two diodes, for example, a triple well is formed in the silicon substrate.

In a further suitable method embodiment, the landing pad has a plurality of contact areas spaced apart from one another with which—without the insulating intermediate layer—it is applied onto the silicon substrate. For each of these contact areas, at least one diode (for example, the at least one well forming it) is introduced into the silicon substrate. This means that, for each contact area of the landing pad, in the context of the diode structure, at least one associated diode and optionally the respective series connections of two diodes (in particular via the aforementioned triple well) is generated.

In particular, for the case where the landing pad is subdivided as described above into a plurality of contact areas, in a suitable method embodiment, the diode structure is structured to form a tree-like distribution of the diodes. In particular, herein the diode structure is configured (in particular the triple well is structured) such that in particular for all contact areas of the landing pad, a diode designated the "central diode" or "root diode" toward the silicon substrate (in particular an undoped or slightly doped material region of the silicon substrate) comes about, and a plurality, in particular, of "branch diodes" linked, in particular, in series with the central diode, each of which is assigned to one of the contact areas of the landing pad and in the proper production condition, is contacted with it. This means that assigned to each contact area of the landing pad is a separate diode (in particular with the same blocking direction), each of which is linked to a common diode (the root diode, which has in particular an opposing blocking direction) in relation to the silicon substrate. By this, in particular, the doping of the silicon substrate required for the triple well is simplified, since a separate triple well is not required to be made for each contact area. Preferably, in addition, the branch diodes are arranged blocking toward the central or root diode.

In an optional method embodiment, a metallic contacting layer is introduced between the respective contact area of the landing pad and the silicon substrate. For example, tungsten or the like is selected as the metal. This contacting layer advantageously prevents—particularly in the case that the landing pad is made of copper—a diffusion of copper into the silicon substrate.

In a preferred method embodiment—in particular subsequently to the (function) test of the integrated circuit—in order to form the through silicon via from a side of the silicon substrate facing away from the landing pad, a (particularly bore-like) channel is introduced such that the respective diode structure, optionally the corresponding (multi)well is penetrated as far as the respective contact area of the landing pad. This channel is formed, in particular, with an etching method. The penetration of the diode structure, specifically the respective well, is relatively simple in comparison with the opening of an oxide layer, and in particular is favored in that the respective well, despite its doping, deviates not at all or only slightly in its etching behavior from the material region of the silicon substrate that is usually weakly (slightly) doped as compared with the respective well. In the event of slight deviations in the etching behavior, this can be relatively easily compensated for by way of an adapted process control, in particular in the last etching cycles (acting in the region of the well). Preferably, a deep reactive ion etching known also as the Bosch process is used as the etching process.

Preferably, the further formation of the through silicon via takes place in a known manner. In particular, for this purpose, in the channel formed, specifically in the side walls thereof, an insulating oxide is formed (or deposited), so that the silicon substrate and the diode structure formed through the or each well—which possibly remains round the channel—is insulated against the electrically conductive layer of the through silicon via. Subsequently, this insulating oxide—if required—is opened toward the landing pad, in particular toward the respective contact area thereof, optionally a barrier layer is introduced into the channel and thereafter, the channel inner wall is coated with an electrically conductive metallization. Particularly for the case where the conductive metallization is formed by a copper layer, the barrier layer is previously introduced in order—similarly to the above described contacting layer—to prevent a diffusion of copper into the silicon substrate. For the optional case that the conductive metallization is formed by tungsten, the barrier layer can be dispensed with.

In a preferred method embodiment, CMOS process technology is used for the production of the integrated circuit.

An inventive integrated circuit of at least one embodiment can be produced, in particular, by way of at least one embodiment of the method described above.

At least one embodiment of the integrated circuit comprises the silicon substrate, the metallic contact structure (i.e. the landing pad), which is applied with the contact area thereof, without interposition of the insulating intermediate layer, onto the silicon substrate and the through silicon via, which is at least partially contacted by the contact area of the landing pad. Furthermore, the integrated circuit comprises the interconnection structure applied onto the silicon substrate, which in turn has the at least one insulating layer and the at least one interconnection layer. The landing pad is contacted with the interconnection layer or at least one of the possibly plurality of interconnection layers. Furthermore, for blocking the current flow between the contact area of the landing pad and the silicon substrate, the diode structure which forms the at least one diode is introduced into the silicon substrate. This diode structure is additionally penetrated by the through silicon via.

The integrated circuit therefore has all the advantages and physical features arising in a similar manner from the method described above.

In a separate embodiment of the invention, the above-described integrated circuit forms a part of a radiation detector, specifically an X-ray detector. Specifically, the integrated circuit thereby forms a part of an evaluating unit arranged downstream of a detection unit (for example, a sensor) of the X-ray detector. Preferably, the integrated circuit thereby faces toward the detection unit (optionally attached thereto in a signal-transmitting manner) and is configured for evaluating electrical signals received from the detection unit. For this purpose, the integrated circuit comprises e.g. A-D converters, discriminators and the like.

The X-ray detector is thereby itself part of an X-ray device, for example, a computed tomography device. This X-ray device also represents a separate embodiment of the invention.

FIG. 1 shows an integrated circuit 1 in a production intermediate step. The integrated circuit 1 comprises a silicon substrate 2 which in the production intermediate step shown is still part of a silicon wafer. A plurality of active circuit structures 4 are introduced into a surface 3 of the silicon substrate 2. For the construction of the integrated circuit 1, a CMOS production process is used. An interconnection structure 6 (also designated "back end of line" or "BEOL") is applied above the active circuit structures 4. This interconnection structure 6 contains a plurality of metallic interconnection layers 8 arranged over one another, contacted in some places between one another in the thickness direction and separated from one another by way of an insulating oxide layer 10 (also "insulating layer") (the individual oxide layers 10 are not shown individually separated).

Applied onto the silicon substrate 2 between the interconnection structure 6 and the silicon substrate 2 is a partially interrupted insulating intermediate layer. This intermediate layer is also formed by an oxide layer, specifically a silicon dioxide and is therefore also designated an "oxidation intermediate layer 12". The interconnection layers 8 are contacted with a metallic contact structure, hereinafter designated "landing pad 14". In the example embodiment according to FIG. 1, the landing pad 14 lies full-surface and without interposition of the oxide intermediate layer 12—this is removed at this site—on the silicon substrate 2. Thus, the landing pad 14 forms a contact area 16 over the entire surface thereof to the silicon substrate 2. On an outer side 18 facing away from the silicon substrate 2, the landing pad 14 is contacted via the interconnection layers 8 with a test connection element designated "test pad 20".

Figure 3:
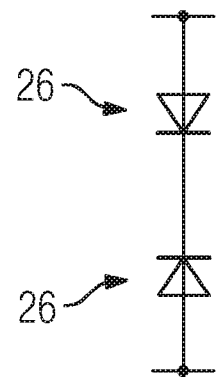
FIGS. 3, 4 show schematic equivalent circuit diagrams, each of an example embodiment of a part of the integrated circuit according to FIGS. 1 and/or 2.
Figure 4:
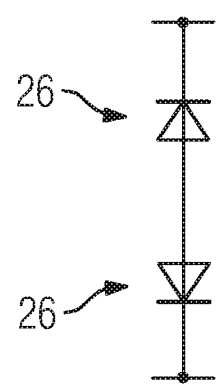
Figure 11:
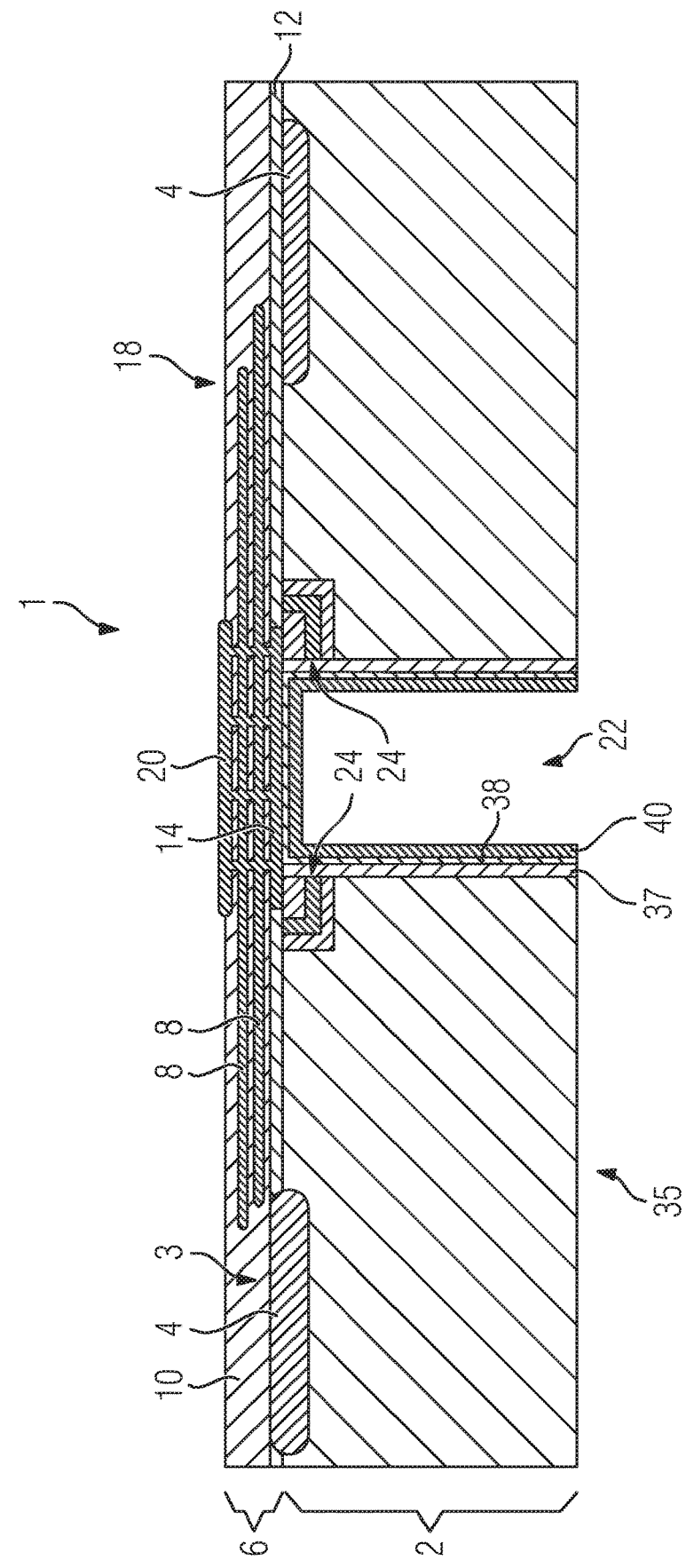

The landing pad 14 serves, in the intended production end state, for contacting the interconnection layers 8 with a so-called through silicon via 22 (shown in FIG. 11). Since the integrated circuit 1 is typically tested for function before the formation of the through silicon via 22—by way of an electrical contact via the test pad 20—a blocking of a current flow between the landing pad 14 and the (fundamentally) conductive silicon substrate 2 is required. Since the insulating oxide intermediate layer 12 is interrupted in the region of the landing pad 14—in order to simplify the later contacting with the through silicon via 22—this oxide intermediate layer 12 cannot serve for blocking the current flow between the landing pad 14 and the silicon substrate 2. Therefore, in the example embodiment shown, a diode structure is introduced by forming a triple well 24 in the silicon substrate 2. The triple well 24 relates specifically to three trough-like strata or layers of the silicon substrate 2 with respectively different doping, which are "stacked on one another". By this, between the surrounding silicon substrate 2 (also designated "bulk silicon") and the contact area 16 of the landing pad 14, two diodes 26 connected in series are formed. The doping of the individual layers of the triple well 24 are selected such that the two diodes 26 connected in series are oriented oppositely with regard to their blocking direction. By this, one of two diodes 26 is always operated in the blocking direction (see FIGS. 3, 4). In concrete terms, the integrated circuit 1 comprises a plurality of landing pads 14 to each of which the above-described diode structure is assigned (not shown in detail).

Figure 2:
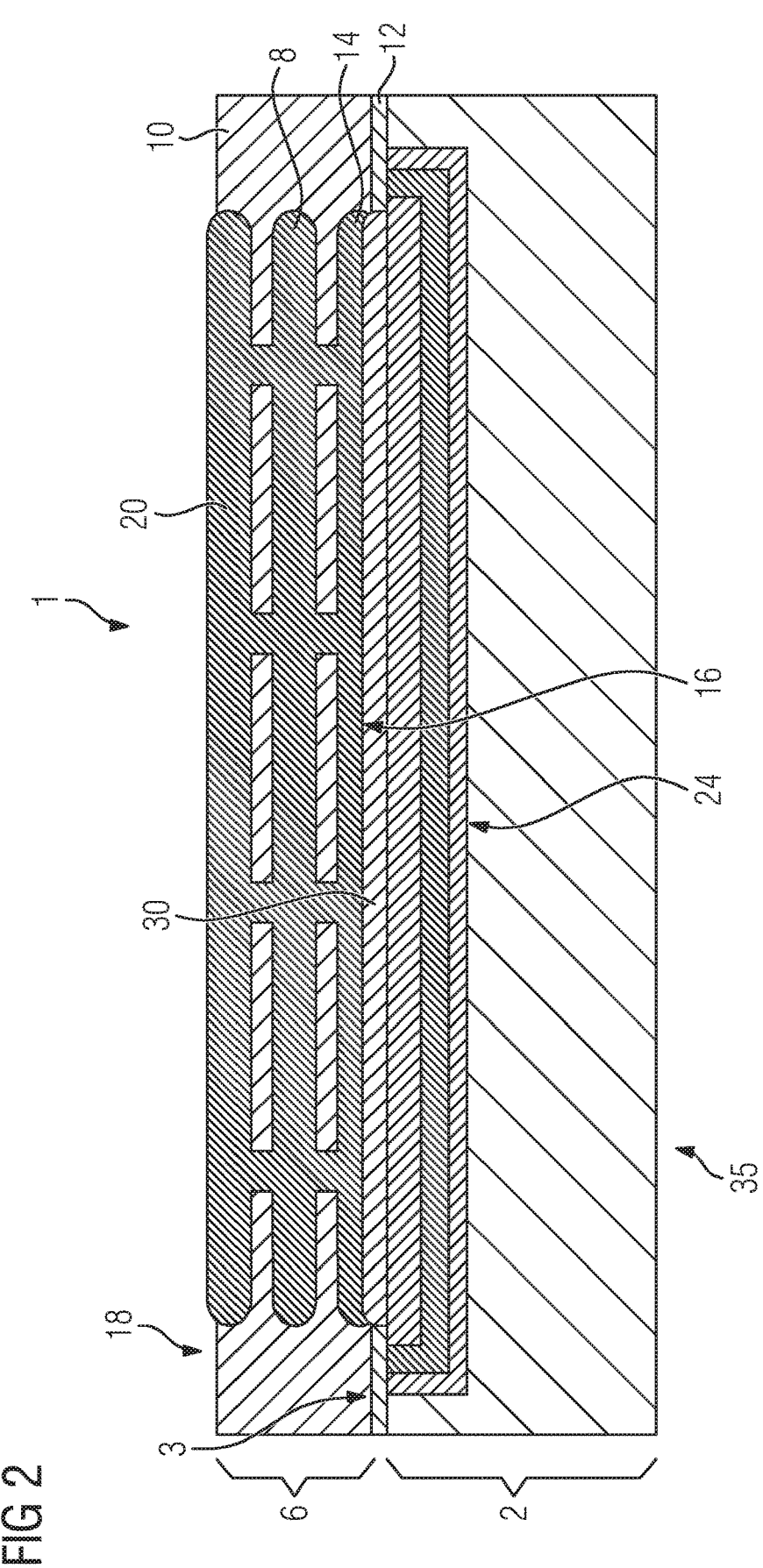
FIG. 2 shows an enlarged view according to FIG. 1 of a further example embodiment of the integrated circuit.

FIG. 2 shows an example embodiment continuing on from FIG. 1. A metallic contacting layer 30 is introduced between the landing pad 14 and the silicon substrate 2, specifically the triple well 24. This is formed specifically from tungsten.

Figure 5:
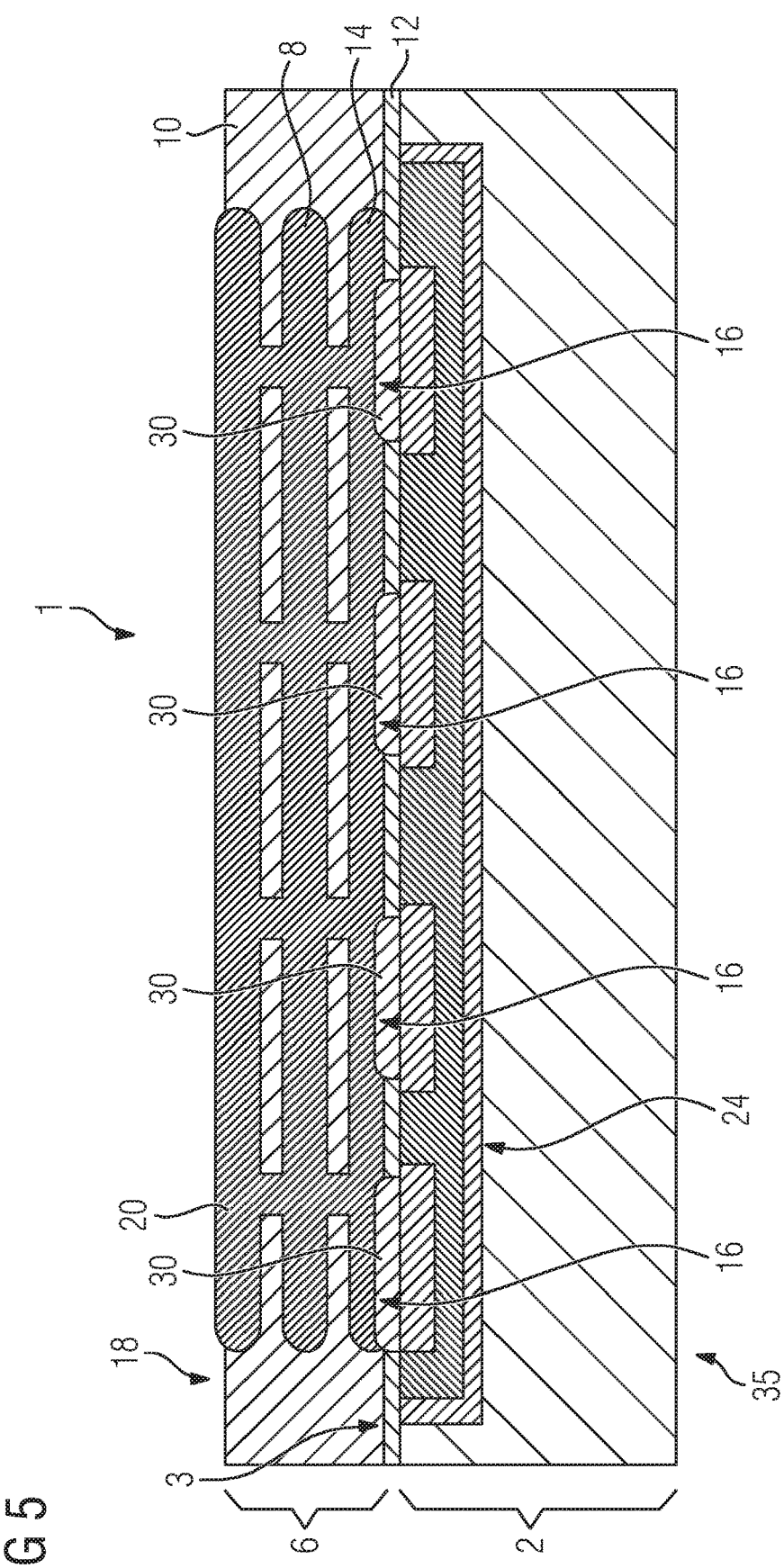
FIG. 5 shows a view according to FIG. 2 of a further example embodiment of the integrated circuit.
Figure 6:
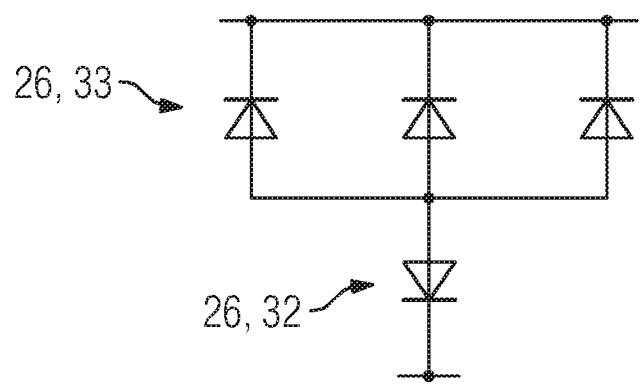
FIG. 6 shows a view according to FIG. 3 of an equivalent circuit diagram of the example embodiment according to FIG. 5, FIGS. 7, 8 show a view according to FIGS. 5 and 6 of a further example embodiment of the integrated circuit and the associated equivalent circuit diagram.

FIG. 5 shows a further example embodiment of the integrated circuit 1. The landing pad 14 again has a plurality of contact areas 16 arranged separately from one another. Between these, the oxide intermediate layer 12 is applied onto the silicon substrate 2. The triple well 24 is configured such that the innermost, that is, toward the surface 3 the uppermost, doping layer is subdivided into a plurality of "islands" assigned to the respective contact areas 16. This results in a tree-like branched or distributed diode structure. This is shown in greater detail in FIG. 6. In concrete terms, with the embodiment of the triple well 24 shown in FIG. 5, a central or root diode 32 is formed toward the surrounding (weakly doped) region of the silicon substrate 2. From this a plurality of "branch diodes 33" (realized through the "islands") branch off, each of which is assigned to one of the contact areas 16. In this way, it is again achieved that via two diodes 26 connected in series opposingly (i.e. the respective branch diode 33 and the common root diode 32), the current flow in both directions between each contact area 16 of the landing pad 14 and the surrounding region of the silicon substrate 2 is blocked.

Figure 7:
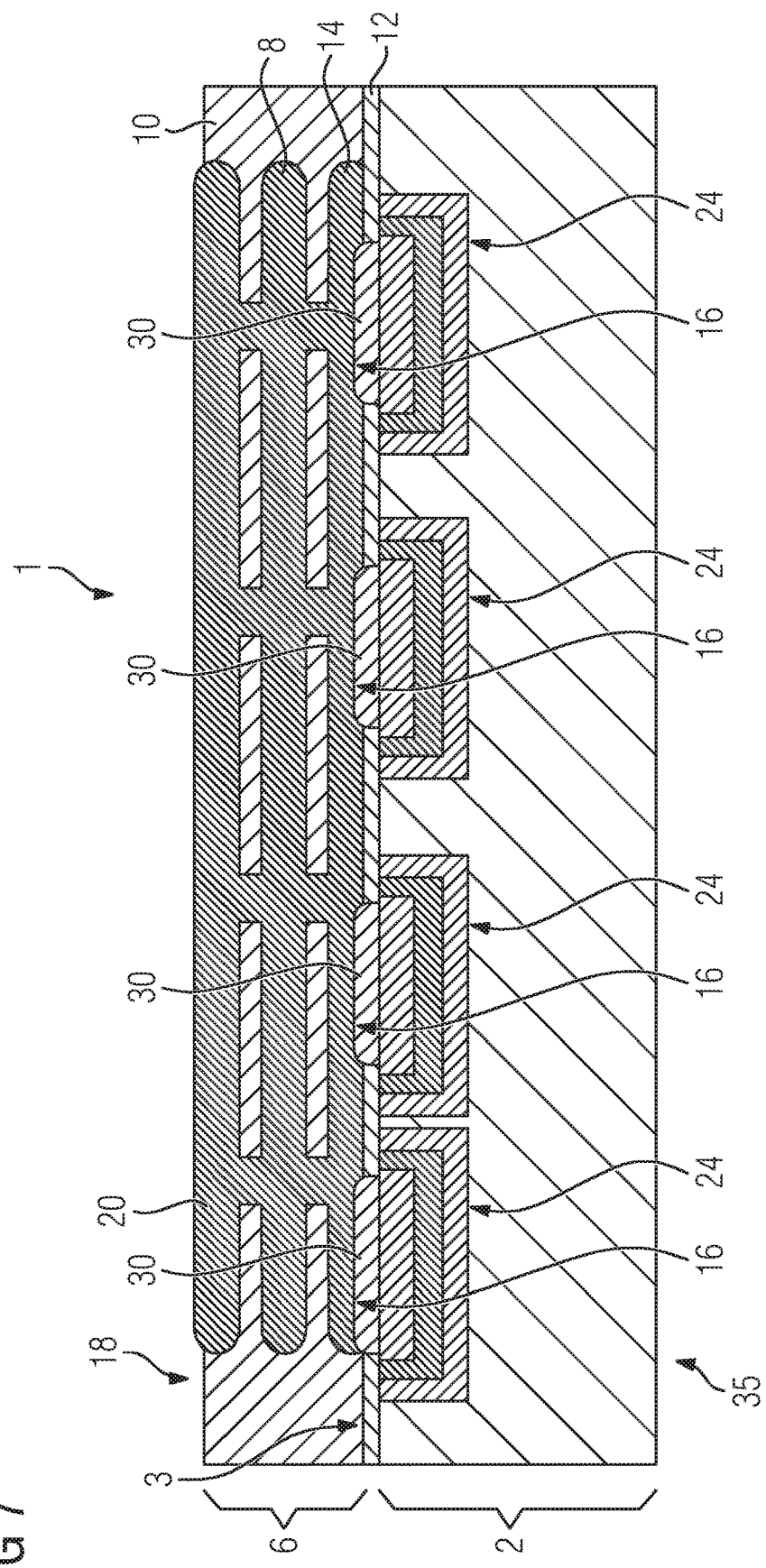
Figure 8:
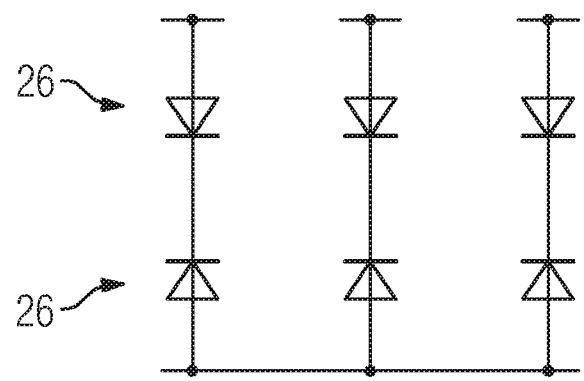

FIG. 7 shows an alternative example embodiment of the integrated circuit 1. In this case, a separately formed triple well 24 is assigned to each individual contact area 16 of the landing pad 14. The corresponding equivalent circuit diagram is shown in FIG. 8.

Figure 9:
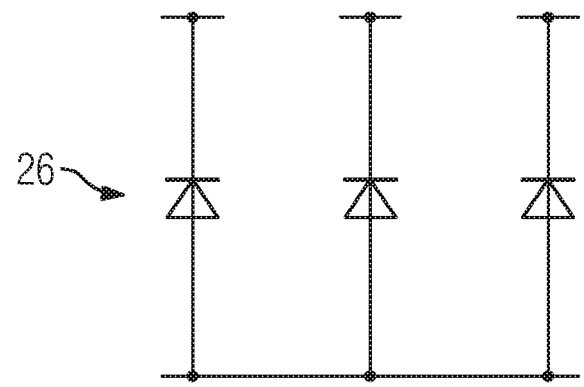
FIG. 9 shows a view according to FIG. 3 of an equivalent circuit diagram of a further example embodiment.

FIG. 9 shows an equivalent circuit diagram of an alternative blocking of the current flow between the respective contact area 16 of the landing pad 14—or a plurality of individual landing pads 14—and the surrounding region of the silicon substrate 2. Herein, a different type of well, specifically a double well is selected, by which only one diode 26 is formed between the landing pad 14 or the respective contact area 16 thereof and the surrounding region of the silicon substrate 2. This double well (not shown in detail) is selected such that the respective diode 26 acts blockingly against a current flow from the landing pad 14 in the direction toward the silicon substrate 2.

Figure 10:
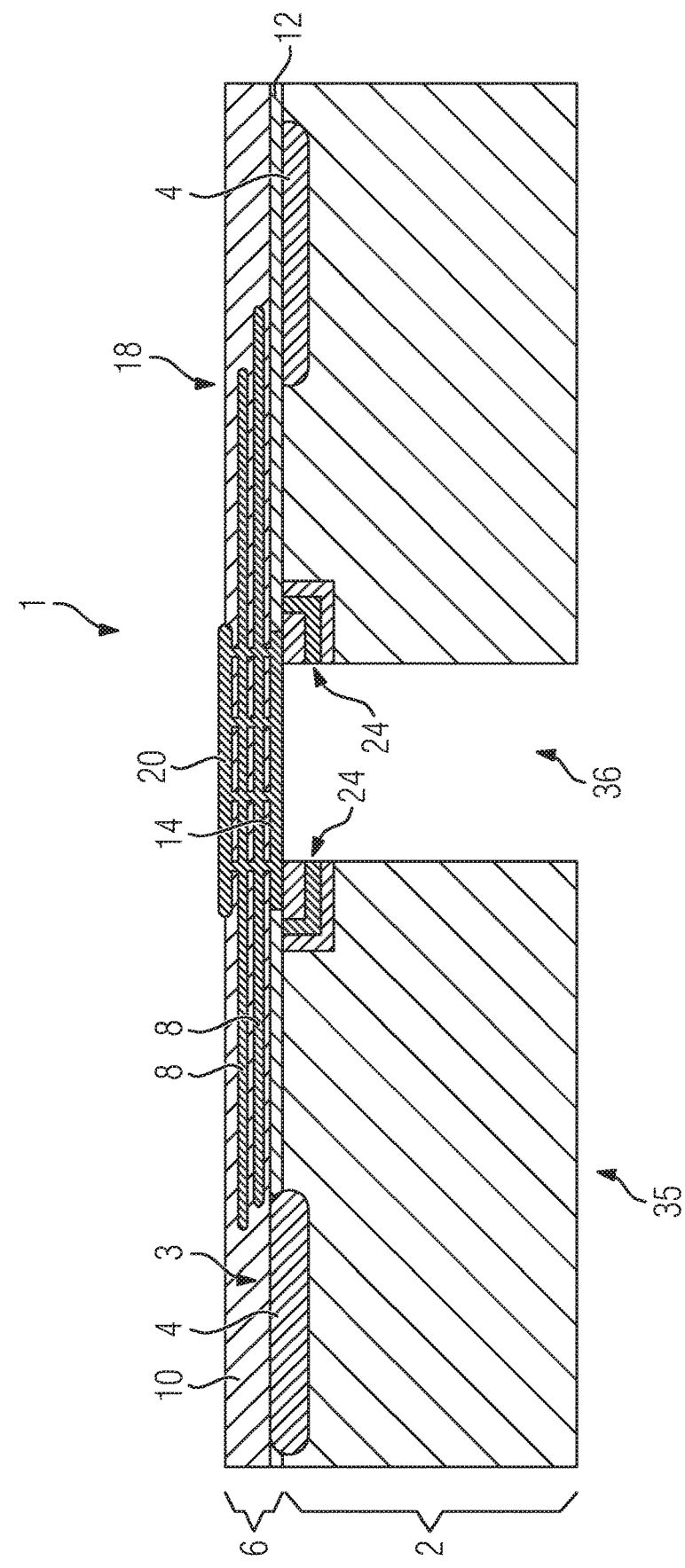
FIGS. 10, 11 show a view according to FIG. 1 of the integrated circuit in two further production steps.

FIG. 10 shows a method step (or a further production intermediate step) which follows on from a test of the integrated circuit 1, specifically the active circuit structures 4 before the formation of the through silicon via 22. The integrated circuit 1 is therein configured according to the example embodiment shown in FIG. 1. From a rear side 35 of the silicon substrate 2, initially a channel 36 is introduced into the silicon substrate 2 and "advanced" through the triple well 24 as far as the landing pad 14. Herein, a deep reactive ion etching is used.

In a further intermediate production step (not shown in detail), the walls of the channel 36 are provided with an oxide layer 37 which serves to insulate the channel 36 relative to the silicon substrate 2 and the individual doped layers of the triple well 24. This oxide layer 37 is subsequently opened on the bottom side, i.e. toward the landing pad 14. Subsequently, a barrier layer 38 is applied onto the side walls of the channel 36—i.e. onto the oxide layer 37 and the landing pad 14. Subsequently, a metallic layer 40 which forms the electrically conductive layer of the through silicon via 22 is applied to the barrier layer 38. By way of this metallic layer 40, therefore, the landing pad 14 is electrically contacted from the rear side 35 of the silicon substrate 2.

Optionally, in subsequent production steps, the integrated circuit 1 is sawn out of the silicon wafer and thereby "separated". Further optionally, the silicon substrate 2 is ground down on the rear side in order to reduce the layer thickness.

Figure 12:
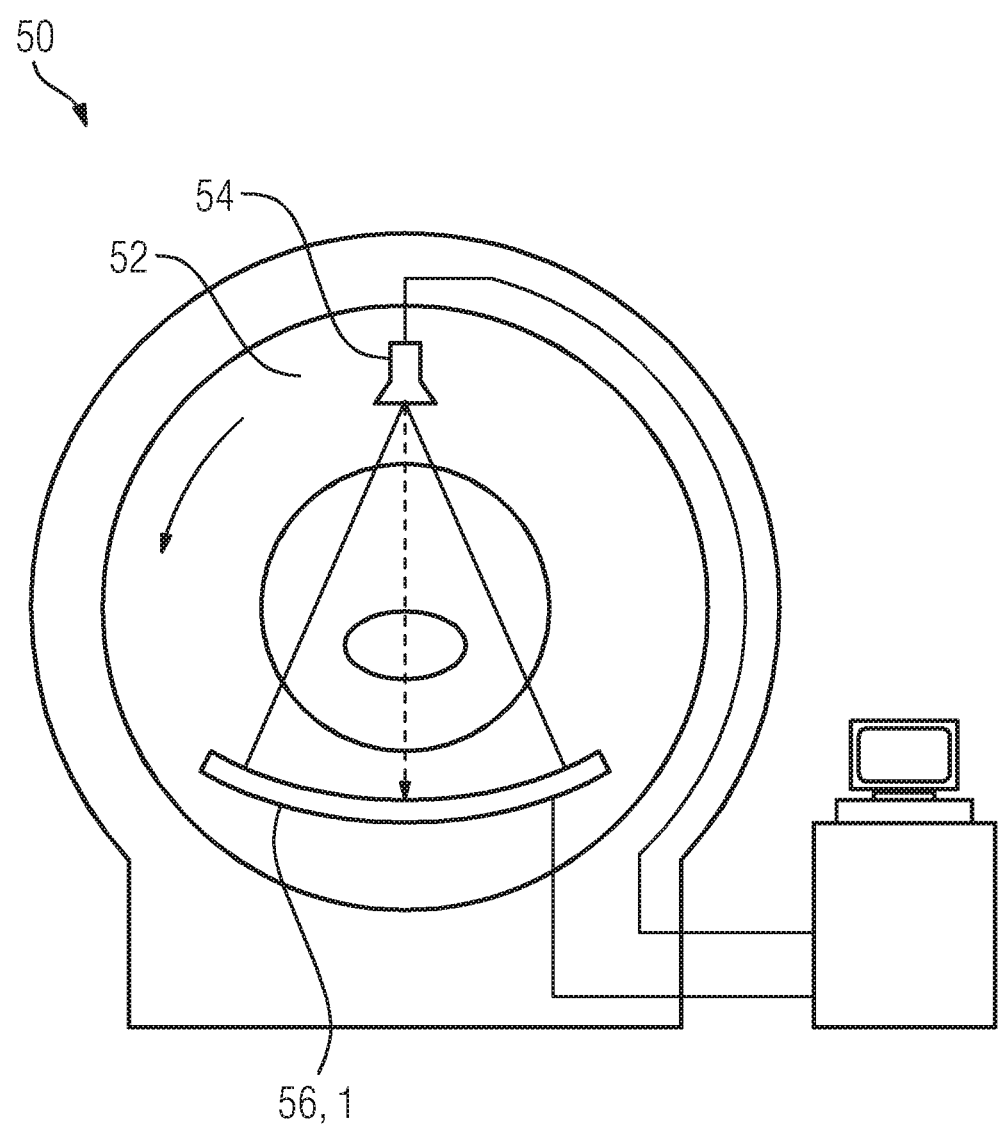
FIG. 12 shows a schematic front view of an X-ray device which comprises the integrated circuit.

FIG. 12 shows an X-ray device 50, specifically a computed tomography device. It has an X-ray system mounted on a rotating assembly 52 (or gantry), formed from an X-ray source 54 and an X-ray detector 56 arranged opposite thereto. The X-ray detector 56 has a plurality (not shown in detail) of detection units facing toward the X-ray source 54 and integrated circuits 1, arranged downstream thereof, for evaluation. The integrated circuits 2 thereby each specifically form a part of an evaluating unit of the X-ray detector 56.

Figure 13:
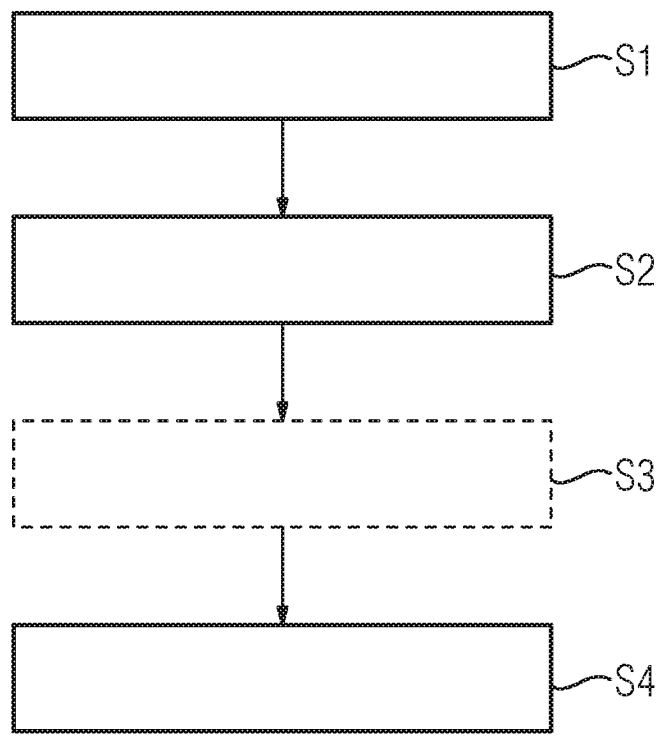
FIG. 13 shows a schematic of a method sequence.

FIG. 13 shows schematically a method sequence according to an embodiment of the invention. In a first step S1 of the first application, a metallic contact structure 14 for a through silicon via 22 with a contact area 16 without an insulating intermediate layer 12 is applied onto a silicon substrate 2.

In a step S2 of the second application, an interconnection structure 6 with at least one insulating layer 10 and at least one interconnection layer 8 is applied onto the silicon substrate 2.

According to a variant embodiment of the inventive method, the contact structure 14 is contacted with the interconnection layer 8 or at least one of the possibly plurality of interconnection layers 8. In this simple variant, the landing pad thereby forms a part of the interconnection layer or one (in particular the "lowest") of the possibly plurality of interconnection layers and is therefore contacted therewith "from the outset".

According to an alternative inventive variant embodiment of the method, in a step S3 of contacting, the contact structure 14 can be contacted with the interconnection layer 8 or at least one of the possibly plurality of interconnection layers 8.

In a step S4 of introduction, a diode structure 24, 26 for blocking a current flow between the contact area 16 of the metallic contact structure 14 and the silicon substrate 2 is introduced into the silicon substrate 2.

The subject matter of the invention is not restricted to the above described preferred example embodiments. Rather, further embodiments of the invention can be derived from the above description by persons skilled in the art. In particular, the individual features of the invention described on the basis of the different example embodiments and their embodiment variants can also be combined in another way.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for producing an integrated circuit, the method comprising:
   applying a metallic contact structure, for a through silicon via with a contact area, onto a silicon substrate without an insulating intermediate layer;
   applying an interconnection structure, with at least one insulating layer and at least one interconnection layer, onto the silicon substrate;
   contacting the metallic contact structure with at least one of the at least one interconnection layer; and
   introducing a diode structure, for blocking a current flow between the contact area of the metallic contact structure and the silicon substrate, into the silicon substrate.

2. The method of claim 1, wherein the contacting includes contacting the metallic contact structure on an outer area of the insulating layer, situated opposite the silicon substrate, with a test connection element.

3. The method of claim 2, wherein the diode structure is configured such that a series connection of two diodes is created for blocking the current flow between the metallic contact structure and the silicon substrate.

4. The method of claim 3, wherein the two diodes are oriented mirror-inverted with regard to a blocking direction.

5. The method of claim 1, wherein the diode structure is configured such that a series connection of two diodes is created for blocking the current flow between the metallic contact structure and the silicon substrate.

6. The method of claim 5, wherein the two diodes are oriented mirror-inverted with regard to a blocking direction.

7. The method of claim 1, wherein the diode structure is created by at least one well being introduced into the silicon substrate.

8. The method of claim 7, wherein the diode structure is created by a triple well being introduced into the silicon substrate.

9. The method of claim 1, wherein the applying of the metallic contact structure includes applying the metallic contact structure onto the silicon substrate with a plurality of contact areas spaced apart from one another, and wherein for each contact area, a diode is introduced into the silicon substrate.

10. The method of claim 9, wherein the diode structure is structured to form a tree-like distribution of diodes with a central diode toward the silicon substrate and a plurality of branch diodes linked to the central diode, each of the plurality of branch diodes being assigned to one of the plurality of contact areas.

11. The method of claim 1, wherein a metallic contacting layer is introduced between a respective contact area of the metallic contact structure and the silicon substrate.

12. The method of claim 1, wherein, for forming the through silicon via from a side of the silicon substrate facing away from the metallic contact structure, a channel is introduced such that the diode structure is penetrated as far as a respective contact area of the metallic contact structure.

13. The method of claim 1, wherein a CMOS process technology is used.

14. An integrated circuit, comprising:
   a silicon substrate;
   a metallic contact structure, is applied with a contact area onto the silicon substrate, without an insulating intermediate layer;
   a through silicon via, contacted at least in part with the contact area; and
   an interconnection structure, applied onto the silicon substrate, including at least one insulating layer and at least one interconnection layer,
   wherein the metallic contact structure is contacted with at least one of the at least one interconnection layer, and wherein a diode structure for blocking a current flow between the contact area of the metallic contact structure and the silicon substrate is introduced into the silicon substrate, the diode structure being penetrated by the through silicon via.

15. An X-ray detector, comprising:
   a detection unit; and
   an evaluation unit, including the integrated circuit of claim 14.

16. An X-ray device, comprising:
   the X-ray detector of claim 15.

* * * * *